(12) United States Patent
Ragay et al.

(10) Patent No.: US 7,805,064 B2
(45) Date of Patent: Sep. 28, 2010

(54) RAPID THERMAL FIRING IR CONVEYOR FURNACE HAVING HIGH INTENSITY HEATING SECTION

(75) Inventors: Peter G. Ragay, La Palma, CA (US); Richard W. Parks, Lakewood, CA (US); Luis Alejandro Rey Garcia, Long Beach, CA (US); Raymond G. Kruzek, Ventura, CA (US)

(73) Assignee: TP Solar, Inc. (Corporation of CA, USA), Paramount, CA (US)

( * ) Notice: Subject to any disclaimer, the term of this patent is extended or adjusted under 35 U.S.C. 154(b) by 764 days.

(21) Appl. No.: 11/768,067

(22) Filed: Jun. 25, 2007

(65) Prior Publication Data

US 2008/0012499 A1    Jan. 17, 2008

Related U.S. Application Data

(60) Provisional application No. 60/805,856, filed on Jun. 26, 2006.

(51) Int. Cl.
*A21B 2/00* (2006.01)
(52) U.S. Cl. .................. 392/416; 392/410; 392/420
(58) Field of Classification Search ............... 392/410, 392/420
See application file for complete search history.

(56) References Cited

U.S. PATENT DOCUMENTS

| 5,740,314 A | 4/1998 | Grimm |
| 6,301,434 B1 | 10/2001 | McDiarmid et al. |
| 6,376,804 B1 | 4/2002 | Ranish et al. |
| 6,566,630 B2 | 5/2003 | Kitamura |

OTHER PUBLICATIONS

20%-Efficient Silicon Solar Cells with Local Contact to the a-Si-Passivated Surfaces by Means of Annealing (COSIMA), Plagwitz, H., et al., Institut fur Solarenergieforschung GmbH, Hameln/Emmerthal (ISFH), Am Ohrberg 1, D-31860, Emmerthal, DE, Proceedings of 20th European Photovoltaic Solar Energy Conference, Barcelona, Spain, 2005, 4 pages.

*Primary Examiner*—Thor S Campbell
(74) *Attorney, Agent, or Firm*—Jacques M. Dulin, Esq.; Innovation Law Group, Ltd.

(57) ABSTRACT

Isolation IR heat lamp module and method of firing multi-zone IR furnaces for solar cell processing comprising lamps disposed in individual parallel channels in a reflector/insulator body to provide a cooling air channel surrounding each tube; the channels are covered with IR-transmissive plate material to isolate each lamp from adjacent lamps and the process zone. Cooling air is exhausted and recycled upstream for energy conservation. Lamp spacing can be varied and power to each lamp individually controlled to provide infinite control of temperature profile in each heating zone. For a spike zone, and in combination with downstream quench control and annealing zones, steep heating and cooling curves with very short dwell (sharp) peak temperature profiles permit faster throughput due to operation of the lampsm at essentially 100% rated capacity, at a 2× or greater heating and throughput rate without compromising lamp life, while producing solar cells with improved output efficiency.

20 Claims, 11 Drawing Sheets

RAPID THERMAL FIRING IR CONVEYOR FURNACE HAVING HIGH INTENSITY HEATING SECTION

CROSS-REFERENCE TO RELATED APPLICATION

This application is the US Regular Application of U.S. Provisional Application Ser. No. 60/805,856 entitled IR Conveyor Furnace Having High Intensity Heating Section for Thermal Processing of Advanced Materials Including Si-Based Solar Cell Wafers, filed by three of us (Ragay, Parks and Rey Garcia) on Jun. 26, 2006, the disclosure of which is hereby incorporated by reference and the priority of which is hereby claimed under 35 US Code Section 119.

FIELD

This application is directed to improved IR conveyor furnaces, particularly useful for metallization firing of screen-printed, silicon solar cell wafers, having an improved spike zone and firing processes that result in higher manufacturing throughput and efficiency of the resulting solar cell photovoltaic element. The improved system is characterized by a spike zone heating chamber utilizing specifically configured high reflectance-efficiency reflectors in cooperation with IR heating lamp elements spaced from the reflectors to create cooling channels that permit the usable power density of the furnace to be substantially increased so that the infra-red heating lamps operate over extended periods of time at up to 100% of rated power output without overheating. The inventive system simultaneously focuses the infra red light generated by the lamps to so that a greater amount enters the process zone thus increasing the heating effect and efficiency of the IR radiation.

BACKGROUND

The fabrication of silicon based solar cells requires a number of specialized processes to occur in a specific order. Generally these processes include single crystalline silicon ingots grown in crystal growing furnaces or cast into multi-crystalline blocks in "directional solidification" furnaces. The result of these processes are long "sausage-shaped" single crystal masses called ingots, or multi-crystalline blocks, from which thin slices of silicon are cut transversely with "wire saws" to form rough solar cell wafers. These wafers, whether made up of a single crystal or multiple crystals conjoined together, are then processed to form smooth wafers in the 150 to 330 micrometer range of thickness. Because of the scarcity of suitable silicon, the current trend is towards making the wafers thinner, typically 180 micrometers thick.

Finished raw wafers are then processed into functioning solar cells, capable of generating electricity by the photovoltaic effect. Wafer processing starts with various cleaning and etching operations, ending in a process called diffusion which creates a semi-conducting "p-n", junction diode. Diffusion occurs at high temperatures in the presence of alternative phosphorous sources such as a sprayed liquid of dilute phosphoric acid or a vapor of phosphorous oxichloride ($POCl_3$) created by bubbling nitrogen, $N_2$, through liquid $POCL_3$. The thus-doped Si forms the "emitter" layer of the photovoltaic cell, the layer that emits electrons upon exposure to sunlight (the normal photon source). These electrons are collected by a fine web of screen printed metal contacts that are sintered into the surface of the cell, as described in more detail below.

To enhance the ability to form low resistance screen-printed metal contacts to the underlying silicon p-n junction emitter layer, additional amounts of phosphorus are deposited onto the front surface of the wafer. The phosphorous is driven into the wafer via a high temperature diffusion process lasting up to 30 minutes. The extra "electrically active" phosphorus enables the low resistance contacts to be formed. However, the formation of such contacts is at the expense of a loss in cell efficiency. The cell efficiency loss arises as a result of electron-hole pairs generated at or near the surface through the absorption of higher energy but short wave length photons. These "blue light" photons quickly recombine and are lost, thereby eliminating their contribution to the power generation of the cell.

After diffusion and various cleaning and etching processes to remove unwanted semi-conductor junctions from the sides of the wafers, the wafers are coated with an anti-reflective coating, typically silicon nitride ($SiN_3$), generally by plasma-enhanced chemical vapor deposition (PECVD). Between some of these processes, the wafers are dried in preparation for subsequent processes in low temperature drying ovens.

The $SiN_3$ anti-reflective coating (ARC) is deposited to a thickness of approximately ¼ the wavelength of light of 0.6 microns. After ARC application, the cells exhibit a deep blue surface color. The ARC minimizes the reflection of incident photons having wavelengths around 0.6 microns.

The ARC $SiN_x$ coating is created in the PECVD process by mixing silane, $SiH_4$, ammonia, $NH_3$, and pure nitrogen, $N_2$, gases in various concentrations in a high or low frequency microwave field. The hydrogen dissociates and diffuses very rapidly into the silicon wafer. The hydrogen has a serendipitous effect of repairing bulk defects, especially in multi-crystalline material. The defects are traps where electron-hole pairs can recombine thereby reducing cell efficiency or power output. During subsequent IR firing (see below), elevated temperatures (above 400° C.) will cause the hydrogen to diffuse back out of the wafer. Thus, short firing times are necessary to prevent this hydrogen from 'out-gassing' from the wafer. It is best that the hydrogen is captured and retained within the bulk material (especially in the case of multi-crystalline material).

The back of the solar cell is covered with an aluminum paste coating, applied by a screen printing process. This Al coating is first dried, then "fired" in an IR furnace to alloy it with the boron-doped silicon, thereby forming a "back surface field". Alternately, the back surface aluminum paste is dried, then the wafer is flipped-over for screen-printing the front surface with silver paste in electrical contact patterns which are then also dried. The two materials, back surface aluminum and front surface silver contact pastes are then co-fired in a single firing step (the subsequent firing referred-to above). This co-firing saves one processing step.

The back surface typically is fully covered by the aluminum-based paste, while the front or top surface is screen printed with a fine network of silver-based lines connected to larger buss conductors to "collect" the electrons generated within the depleted region of the underlying doped Si emitter or near the surface. At the same time, the highest possible open area is left uncovered for the conversion of light into electricity. After these pastes have been dried, they are "co-fired". The back surface aluminum alloys while the front surface paste is sintered at high speed and at high temperature in conveyor furnaces to form smooth, low ohmic resistance conductors on the front surface of the solar cell.

The instant invention is directed to such co-firing alloying/sintering processes and IR furnaces for such co-firing or other industrial processes. Currently available IR conveyor furnaces for such co-firing, alloying/sintering processes have a heating chamber divided into a number of regions. Each region is insulated from the outside environment with various forms of insulation, compressed insulating fiber board being the most common. Typically, the first zone, just inside the entrance is supplied with a larger number of infra-red (IR) lamps than the next 2 or 3 zones to rapidly increase the temperature of the incoming silicon wafers to approximately 425° C. to 450° C. This temperature is held for the next few zones to stabilize the wafers' temperature and insure complete burn-out of all organic components of the silver paste. The goal is to minimize all carbon content within the contacts, as carbon is understood to increase contact resistance.

Fast firing generally gives optimum results because the impurities do not have time to diffuse into the emitter. A high rate of firing is critical as the activation energy for the impurities to diffuse into the doped Si emitter region is generally lower than that for sintering the silver particles. To achieve this high firing rate, the wafers enter a high IR-intensity "spike" zone where the wafers' temperature is quickly raised into the range of 700-950° C., and then cooled, by a variety of means, until the wafers exit the furnace. The wafers are not held at the peak temperature. Rather, the peak width should be minimal, that is, the dwell short, while the ascending and descending rate slopes should be steep.

However, in the current state of the IR furnace art these desiderata are not met. Rather, the high intensity spike zone is simply a copy of the first zone wherein IR lamps are arrayed across the wafer transport belt, both above and below the belt and its support system. As a result, the current art suffers from highly inefficient use of the IR lamps that heat the wafers in the various processing zones, and an excess dwell characterized by a broad peak and shallow rate slopes temperature curve in the spike zone. Currently available furnaces are able to generate in the range of from about 80° C. to about 100° C./second rate of temperature rise in the spike zone. Since the peak temperature must approach 1000° C., the currently available rate of rise at the constant conveyor transport rate requires the spike zone to be physically long since the belt moves at a constant speed. The dwell peak of current processes is also too long.

The shallow curve/broad peak characteristic process limitation of currently available furnaces has deleterious effects on the metal contacts of the top surface which significantly limits cell efficiency as follows. The front surface silver paste typically consists of four phases:

(1) a vehicle phase which acts as a carrier for the powders and consists of volatile solvents and non-volatile polymers; the solvents evaporate during the drying step and the polymers are removed during the burn-out step; both steps occur before the actual peak zone firing step;

(2) a binder phase (organic resin and glass frit) which holds the paste to the substrate, dissolves the metal powder and provides adhesion to the substrate during firing;

(3) a functional phase (metallic particles that are either shaped as small spheres or as flakes); and (4) modifiers (such as flux) which are small amounts of additives proprietary to the paste manufacture but which impact the required thermal profile used in firing.

The solvent is evaporated completely in the dryer prior to firing. The resins must then be burned out completely to prevent carbon from interfering with the electrical quality of the metal contacts. This is achieved around 425° C. to 450° C. As the temperature continues to rise in the firing process, the glass frit begins to melt. The temperature of this aspect of the process depends on the composition of the glass frit and its glass transition temperature, $T_g$. Lead oxide is an important constituent of the frit since it dissolves the silver particles. $T_g$'s are typically around 550° C.-600° C., at which the glass frit transitions from a solid, amorphous structure to one that is more fluid and can flow. Temperatures in the process continue to rise to 700° C.-950° C. range to sinter together the silver particles thus forming a lower resistance conductor.

It is important to accomplish this sequence quickly for several reasons. First, the frit glass must not flow too much, otherwise the screen-printed contact lines will widen and thereby reduce the effective collection area by blocking more of the cell surface from incident solar radiation. Secondly, the glass frit should not mix with the silver particles to any great extent since this will increase series resistance of the contacts. Finally, all of this material must etch through the $SiN_x$ anti-reflective (ARC) coating (about 0.15 micrometers in thickness or ¼ of the 0.6 micrometer target wavelength for reflection minimization) but not continue to drive through the "shallow", doped Si emitter layer, previously formed by the diffusion of phosphorus onto the top surface of the p-type silicon. Emitters are generally 0.1 to 0.5 micrometers in thickness, but shallow emitters are generally in the 0.1 to 0.2 micrometer range.

Thus, to control the etch depth, the sinter must be quenched both quickly and thoroughly. Quenching, that is, preventing diffusion of the silver particles into the silicon below the emitter (forming crystallites) after etching the AR coating and creating good adhesion of the glass to the silicon substrate, must be accomplished by rapid cooling. This is critical. If the silver drives too deep into the doped Si emitter layer, the junction is shorted. The result is that the cell looses efficiency due to a short circuit path for the electrons produced. This is also known as a low shunt resistance property of the cell.

But in contradiction, it is also vitally necessary to slow rapid cooling in order to anneal the glass phase to improve adhesion. Taken together, the cooling curve looks like this: rapid cooling from the peak firing temperature to about 700° C., then slow cooling for annealing purposes, then rapid cooling to allow the wafer to exit the furnace at a temperature low enough to be handled by robotics equipment that must have rubberized suction cups to lift the wafers off the moving conveyor without marring the surface.

Since there are dimensional and IR lamp cost constraints, increasing lamp density in the spike zone is not generally a feasible solution. In addition, the peak temperature is held only for a few seconds in the spike zone and the descending thermal profile needs to be sharp. Increasing lamp density can be significantly counter-productive, in that the increased density easily results in a more gradual slope due to the reflection off the product and the internal surfaces of the spike zone.

Likewise, increasing the power to the lamps is not currently feasible because higher output can result in overheating of the lamp elements, particularly the external quartz tubes. Most furnaces are thermocouple controlled. Since the IR lamps are placed side by side, on the order of 1.25" apart, each lamp heats adjacent lamps. When the thermocouples detect temperatures approaching 900° C., they automatically cut back power to the lamps. This results in lower power density, changes in the spectral output of the IR lamp emissions (hence a lower energy output), and results in the need to slow down the conveyor belt speed, thus slowing processing. In turn, this results in a ripple effect into the other zones, since the belt is continuous and slowing in one zone slows the belt in all zones, so that adjustments must be made in all zones to compensate. In turn, slowing upstream or downstream zones affects the firing zone. Overheating of lamps, e.g., due to thermocouple delay or failure, can cause the lamps to deform, sag and eventually fail. This deformation also affects uniformity of IR output delivered to the product.

It is important that the atmosphere be controlled in the furnace. While many metallization furnace operations operate in an air atmosphere, the atmosphere must be relatively controlled and laminar or minimally turbulent, as incoming air can introduce particulates that contaminate the substrate surfaces, and internal turbulence can disturb the product substrate wafers because they are so very thin, light and fragile, being on the order of 150-350 micrometers thick, In addition, at high temperatures, internal turbulence could cause lamp vibration leading to fatigue failure, or inconsistent or reduced output.

Accordingly, there is an unmet need in the IR furnace and IR firing process art to significantly improve net effective heating rate of conventional lamps, to provide better control and thermal profiles in the spike zone, to permit improved control of furnace temperature and atmosphere conditions, to improve quenching and annealing profiles, to improve the uniformity of heat in furnace zones, and to improve throughput of such furnaces, while accomplishing these goals on the same or reduced furnace foot-print.

THE INVENTION

SUMMARY

The invention is directed to a conveyor or batch-type IR furnace having a plurality of thermal heating zones, including at least one spike zone, in which IR heating elements are isolated and air or inert gas cooled, resulting in effectively doubling the heating rate and furnace processing throughput of advanced materials, such as silicon, selenium, germanium or gallium-based solar cell wafers.

The invention also includes all process control systems that lead to improved solar cell production, and the methods of firing to achieve improved efficiency solar cells as a result of better control of process operations characterized by sharp temperature ascending and descending temperature curves, very sharp peak and precise control of quenching and annealing temperature profiles. The improved control of the invention extends throughout the burn-out, spike, quench, stop-quench and annealing (tempering) zones for improved contact formation, reduction of hydrogen out-gassing, control of the etch depth and improved adhesion, as well as improved efficiency of cell output.

The inventive lamp isolation system is implemented by way of example in a spike zone module having a plurality of reflector elements having parallel channels, centered in each of which is one or more IR lamp(s). The channels are covered with an IR transparent transmission window, such as quartz, Vicor, and Pyrex, Robax or other high temperature glass, synthetic sapphire, and the like. The heating modules are disposed facing each other and spaced apart, one above the furnace conveyor belt and one below, to define the product processing zone therebetween from which the lamps and cooling air channels are isolated.

The IR-isolation of the lamps prevents adjacent lamps from heating each other. The channels have a wide range of cross-sectional geometries, including square, rectangular, triangular, semi-circular, parabolic, or they form partial pentagonal, hexagonal, octagonal or ellipsoidal forms. The channel geometry is selected to direct the IR radiant energy toward the product traversing the furnace conveyor belt, rather than heating adjacent lamps by direct radiation.

The channels are open at their opposite ends for inlet, or/and exhaust of cooling gas flow. Cooling gas is introduced at least at one end of each channel via a manifold, and is exhausted at the other end, or medially of the ends.

This combined IR/cooling/process zone isolation geometry of the inventive heating module permits increasing the power to the lamp to essentially full rating. This results in increase in the heating rate to from about 160° C./sec to about 200° C./sec, that is, effectively doubling the heating rate of conventional 100 watt/inch lamps without resulting in lamp turn down, shut down or deformation. In addition, the inventive lamp isolation system permits increasing the conveyor belt speed and thereby the throughput of product and yield. By way of example only, whereas currently available conveyor furnaces operate at conveyor speeds of about 150"/minute, the inventive heating element isolation system permits doubling the rate to about 300"/minute, and that increased rate is at spike zone peak temperature in the range of 900° C.±40° C. While some currently available conveyor furnaces claim to be operable at up to about 250"/min, they cannot operate at high power density.

The inventive conveyor furnace comprises a housing or shell forming a chamber insulated with conventional forms of insulation such as fiber, fiber board, or fire brick. The inventive heating module(s) is/are disposed within the outer insulated shell. A conveyor belt is located between the upper and lower heating modules, and appropriate power and control systems are integrated in the furnace system. The space between the windows is the passageway for the conveyor belt carrying the advanced materials substrates being fired. This is the processing zone; the exemplary processing zone described herein functions as a spike zone.

However, it should be understood that a plurality of zones, up to all zones, of the furnace can employ the inventive isolation lamp assembly. For rapid thermal diffusion (phosphorus or boron) and/or rapid thermal oxidation for front surface passivation applications, the inventive fast ramp spike zone can be located at the entrance of the furnace and the plurality of zones can be used to maintain the diffusion temperature or oxidation temperature as the wafers are conveyed through the furnace.

Radiant energy from the upper and/or lower infra-red lamps is focused by reflective backing elements (reflectors), preferably of machined or cast ceramic material, through the front facing transmissive plates (windows) and into the process heating tunnel throughout the entire process zone (burn-out, spike and quench/stop zones) to provide a very intense heating environment. The inventive spike zone will generally operate in the range of 700° C. to 1000° C.

Lamp power, top and bottom, may be adjusted independently or in groups to achieve precise temperature gradient control in each zone. Temperature control may be effected using either thermocouple-based temperature regulation or voltage-controlled power regulation. Regulation by voltage-controlled power is preferred, as it gives the fastest heating rates and more consistent heating results due to maintenance of stable lamp power, and repeatable, definable, and constant spectral output at all times. That is in contract to fluctuating lamp outputs in response to PID control system(s) that are typically used to for temperature maintenance functionality.

In an important aspect of the invention, the process of the invention includes operationally configuring the power, cooling systems (cooling air flow rate, amount and flow paths, and heat exchange parameters) and belt speed, not only to control zones separately from each other, but also to control individual lamps, to achieve a wide range of thermal profiles longitudinally along the materials process flow path throughout the various zones to produce solar cells with significantly improved performance and efficiencies.

The inventive reflector shapes provide three features that permit operation of commercial IR lamps at or near their maximum permissible power levels, without pushing lamp temperatures beyond the safe operating temperature at which the quartz lamp envelopes begin to soften, lose rigidity, sag and eventually fail:

1) The reflector channel geometry results in focusing the output of the IR lamps into a high power beam of energy directed into the process zone for superior usable power density in the process zone;
2) The spacing ribs between adjacent channels prevent lamps from heating adjacent lamps, confining and directing the IR radiation toward the process zone;
3) The reflector is disposed, in conjunction with the transmissive front window and the IR heating element to create and define an annular coolant passage surrounding the length of the lamp thorough which cooling air/gas is passed.

The combination of reflector geometry and the window provides triple isolation functionality: 1) IR isolation; 2) coolant gas or air to individual lamps; and 3) separation of the coolant air flow from the process zone so the very light, fragile wafers are not disturbed by otherwise turbulent air flow.

In a first embodiment, cooling air/gases are directed from one end of the lamp tube to the other end. In a second, preferred embodiment, the cooling air is fed from a distribution manifold through inlet openings at each end of the lamps toward the center of the lamp to an exhaust via hole(s) located at or near the center of the reflector passage. Typically the cooling air is introduced to the lamp ends from a compressed air source, such as a compressor system having a filter and drier.

The cooling air is typically introduced to the lamp ends via inlet manifolds that contain and channel the air until it is introduced into the cooling passages around the lamps. The manifolds are typically equipped with intermediate baffles to distribute the cooling gases evenly to avoid starving some lamps while oversupplying others.

The cooling gas or air exits the cooling channels through central exhaust holes or slots in the back (top or bottom) of the reflector that are located approximately along the process flow centerline of the zone. The cooling gases, by now hot, may be collected and exhausted, or they may be recycled by manifolds or channels into other zones of the furnace; such as, for example: preheating product entering the furnace; energy recapture by recycle back upstream to the burn-out zone; post spike zone tempering of product by slowing the cooling rates of sensitive and fragile materials; or for simply removing organic residue from the substrates in other parts of the process. This recycle of the heated cooling gas permits more efficient use of energy.

To control the etch depth, the sinter developed in the spike zone must be quenched both quickly and thoroughly. Quenching, that is, preventing diffusion of the silver particles into the silicon below the emitter (forming crystallites) after etching the AR coating and creating good adhesion of the glass to the silicon substrate, must be accomplished by rapid cooling. This is critical. If the silver drives too deep into the doped Si emitter layer, the junction is shorted. The result is that the cell looses efficiency due to a short circuit path for the electrons produced. This is also known as a low shunt resistance property of the cell.

In the inventive system and process, this quenching is accomplished in a quench zone characterized by the use of an air knife assembly that uses carefully controlled compressed air volumes with planes of air directed at the top and/or the bottom of the wafer to quickly drop the temperature from the peak zone firing temperature range of from about 800° C. to about 1000° C., to within the range of from about 500° C. to 700° C., typically a drop of 200° C.-400° C. within a second or two.

In addition, it is also vitally necessary to slow or stop the rapid cooling that is produced in the quench zone in order to anneal the glass phase to improve adhesion. This is accomplished in an optional, novel stop-quench zone immediately following the quench zone. This zone includes a limited number of lamps, typically only above the contact face of the wafers, but may also include lamps below the wafers. The use of these lamps stops the rapid cooling, stabilizes the temperature into the range of 450° C.-700 ° C. so that slow, tempering cooling can be provided in the subsequent, downstream annealing zone from about 450° C.-700° C. down to a temperature in the range of from about 30° C.-100° C. at the exit end of the furnace. Optionally, and preferably, cooling air is introduced into this stop-quench zone to improve control of the temperature profile. That is, it is important to control the cooling air and lamps so that there is little or no cooling overshoot, followed by a bounce-back (a curve generally shaped like the mathematical square-root operation symbol, $\sqrt{\ }$) in the annealing zone. The result of the control of lamp power and air in the three zones: peak, quench and stop-quench is a sharp ascending and descending peak with short dwell and smooth curve transition into the annealing zone downstream of the stop-quench zone.

The wafer temperature is held for tempering to improve adhesion in the annealing zone, and near the exit the wafers are cooled further to on the order of 30° C.-100° C. to permit robotic pickers or other handling equipment or personnel to remove the wafers from the conveyor belt and/or from/to a marshalling table to which they are transferred off the belt.

Taken together, the cooling curve can be carefully controlled to any selected and configured temperature profile of a subject process having both heating and cooling curves in the range of from about 80° C. to 200° C. per second. The resulting controlled curves in the firing and downstream zones generally look like this: rapid heating to a sharp, well defined, short dwell peak, rapid cooling from the peak firing temperature of about 850° C.-950° C., down to about 400° C.-500° C., then slow cooling for annealing purposes, and final cooling to allow the wafer to exit the furnace at a temperature low enough (30° C.-100° C.) to be handled by robotic equipment that employ polymeric suction cups to lift the wafers off the moving conveyor with-out marring the surface. The shortness of the dwell at peak temperature, that is, the sharpness of the peak profile, can be controlled and is made possible by the ability to control the cooling, as well as selectively program the belt speed, the power to individual lamps in the peak zone and the cooling in downstream zones, particularly in the quench and stop-quench zones as described above. The inventive furnace system controller is configurable for all zones as needed to provide a pre-selected thermal profile for the particular product being fired.

The inventive IR heating zone(s) is/are characterized as having a high reflectance ceramic/insulation material reflector using any of a number of geometries to encase and isolate the IR lamps and reflect and focus the maximum possible IR light through an IR transmissive plate material, directing it into the process region for heating the product being processed.

The reflector is designed with individual reflecting cavities which house individual lamps, or "clusters" of lamps. The reflecting cavities comprise channels for forced cooling air (or other process gas) to pass, either from each end to center-located exhaust ports, or from end to end with cooling air exhaust on one side and cooling air entrance on the other side. The center exhaust embodiment is preferred.

The cavity or channel-configured reflector element is placed in tight contact with the IR transmissive plate "window" to form the isolation cooling channels which maintain the cooling air in close proximity to the lamps for good heat transfer. The IR transmissive plate keeps high pressure/high velocity lamp-cooling air/gas from entering and disturbing the process region through which the belt and silicon wafers pass, while at the same time permitting large quantities of cooling gases to be used to maintain adequate cooling of the lamp quartz as well as the glass/quartz transmissive plate. This is important as most high temperature glasses such as "Robax" are only usable to about 970° C. and quartz starts softening at 1000° C., while the process of "spiking" to the 900° C. level in the firing zone typically require higher temperatures "at the lamp" to drive the process. This invention allows operation of the lamps at power levels that would normally cause the lamp casings to soften and warp, causing shortened life spans.

In addition, as improvements in lamp design or materials and paste compositions (both front contact paste and back field past) become available in the future, the inventive isolation modules will easily accommodate such advances in the art to provide both improved processes and more efficient cells The reflector channel surface may comprise any geometry such as: parabolic or a higher order surface: e.g., elliptical; semi-circular; triangular; square; rectangular; or trapezoidal.

BRIEF DESCRIPTION OF THE DRAWINGS

The invention is described in more detail with reference to the drawings, in which:

FIG. 3 are a series of schematic elevation views transverse to the product flow axis showing the reflector channel geometry, in which

FIG. 5 is a pair of transverse elevation views down the axis of the flow path showing the relationship of parts in the heating element modules, the cooling paths, and their relationship to the conveyor belt, in which

FIG. 6 is a series of figures showing alternative IR lamp end centering fittings, in which

DETAILED DESCRIPTION OF THE INVENTION, INCLUDING THE BEST MODE

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best modes of carrying out the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. For example, the various electrical and pneumatic connections to lights, brakes and lift bellows, being conventional to those skilled in this art, are not shown. Thus, the best mode embodiment of one feature may be shown in one drawing, and the best mode of another feature will be called out in another drawing.

Figure 1A:
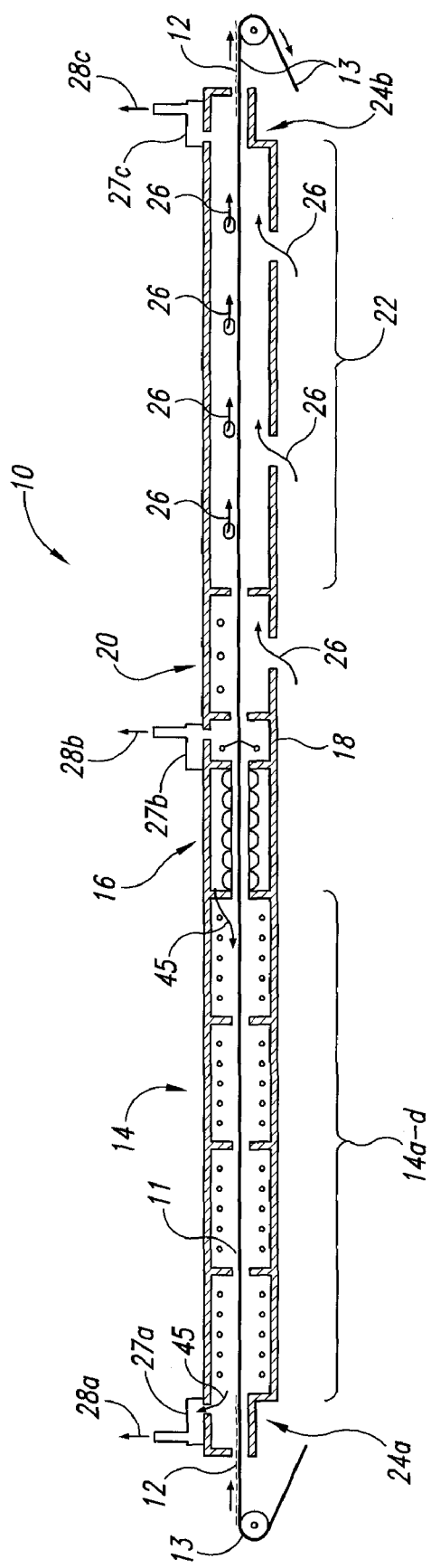
FIG. 1 is series of four side elevation line drawings showing, first in FIG. 1A, a schematic side elevation of the inventive furnace employing at least one isolation heating zone integrated in a burn-out zone, a quench zone, a stop-quench zone and an annealing zone.
FIG. 1B is a vertical section view through the burn-out zone.
FIG. 1C is a vertical section view through the peak firing zone, the quench zone and the stop quench zone as well as the transition into the annealing zone.
FIG. 1D is a vertical section view through the annealing zone.

FIG. 1A illustrates schematically a conveyor furnace 10 comprising a conveyor belt 13 transporting doped solar cell wafers 12 through a process zone 11 that is continuous through a plurality of furnace process modules or sections, including: a burn-out section 14; followed by a peak firing section 16; downstream of which, in sequence are a quench section 18; a stop-quench section 20; and a tempering or annealing section 22, the latter employing air and/or water cooling. The respective process zone portion in each furnace section takes the name of that section; thus, burn-out, peak; quench, stop-quench and anneal "zones" refers both to the process volume through which the conveyor belt traverses as well as the furnace hardware of that section.

The conveyor belt 13, shown schematically, moves left to right and defines the horizontal centerline (above it are the upper modules and below it are the lower modules of the sections or zones) as well as the longitudinal direction; thus, orthogonal to the belt travel is defined as the lateral direction or dimension. No product is shown in FIG. 1 in the process zones 14, 16, 18, 20 and 22 due to the scale of the drawing. Entrance and optional exit baffles 24a, 24b are disposed at the entry and exit ends of the furnace, respectively. Typically there is an upstream dryer, not shown. Intermediate baffles, e.g., between zones 16 and 18, may be provided.

The burn-out section includes a plurality of three or four heating modules 14a-14d, and the firing section includes one or more spike zone modules 16. Note that the burn-out, peak, and stop-quench modules can be the inventive isolation type IR lamp heating modules, or just the spike zone module(s) 16 can be the inventive isolation type.

Figure 1B:
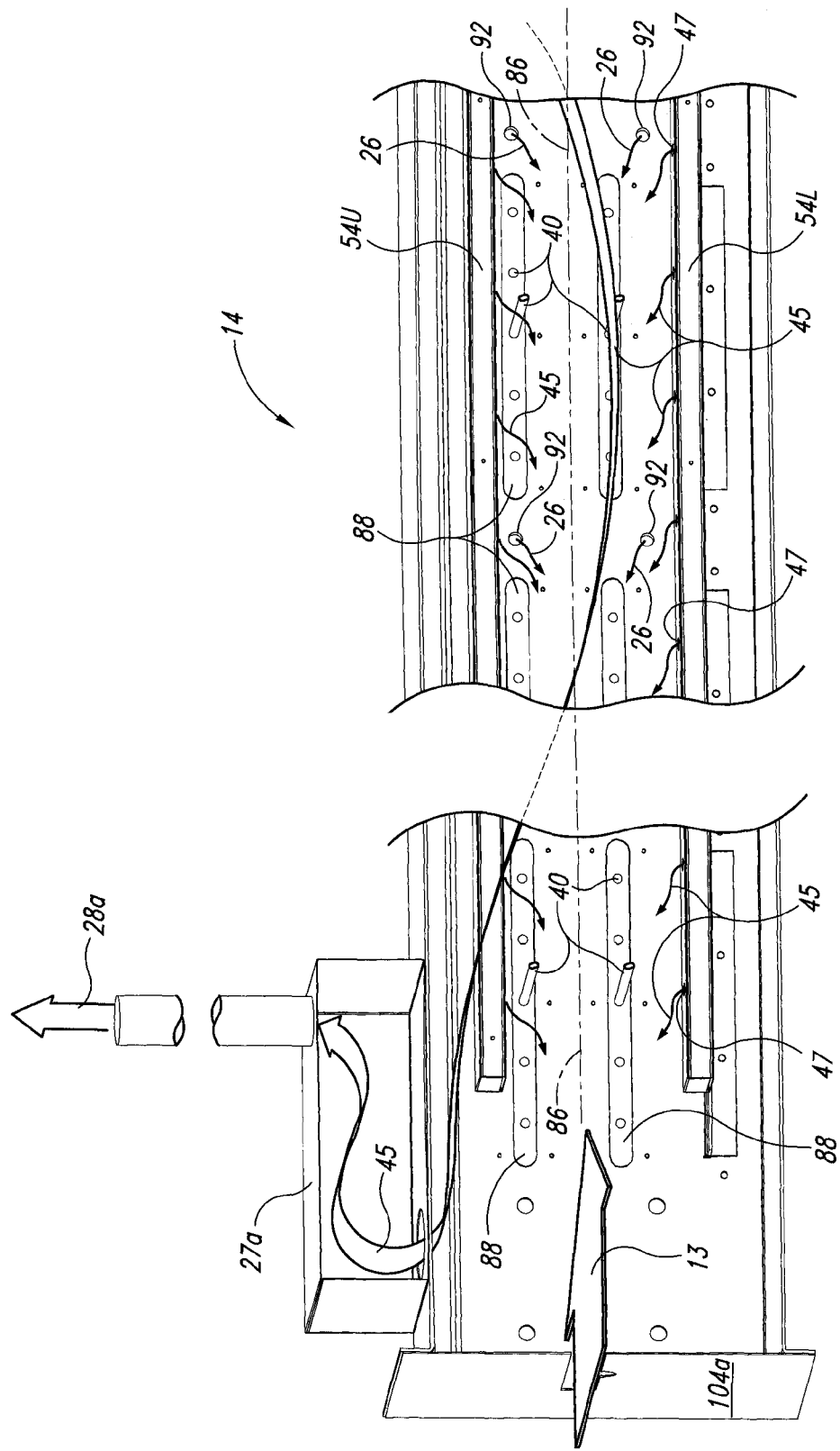
Figure 1C:
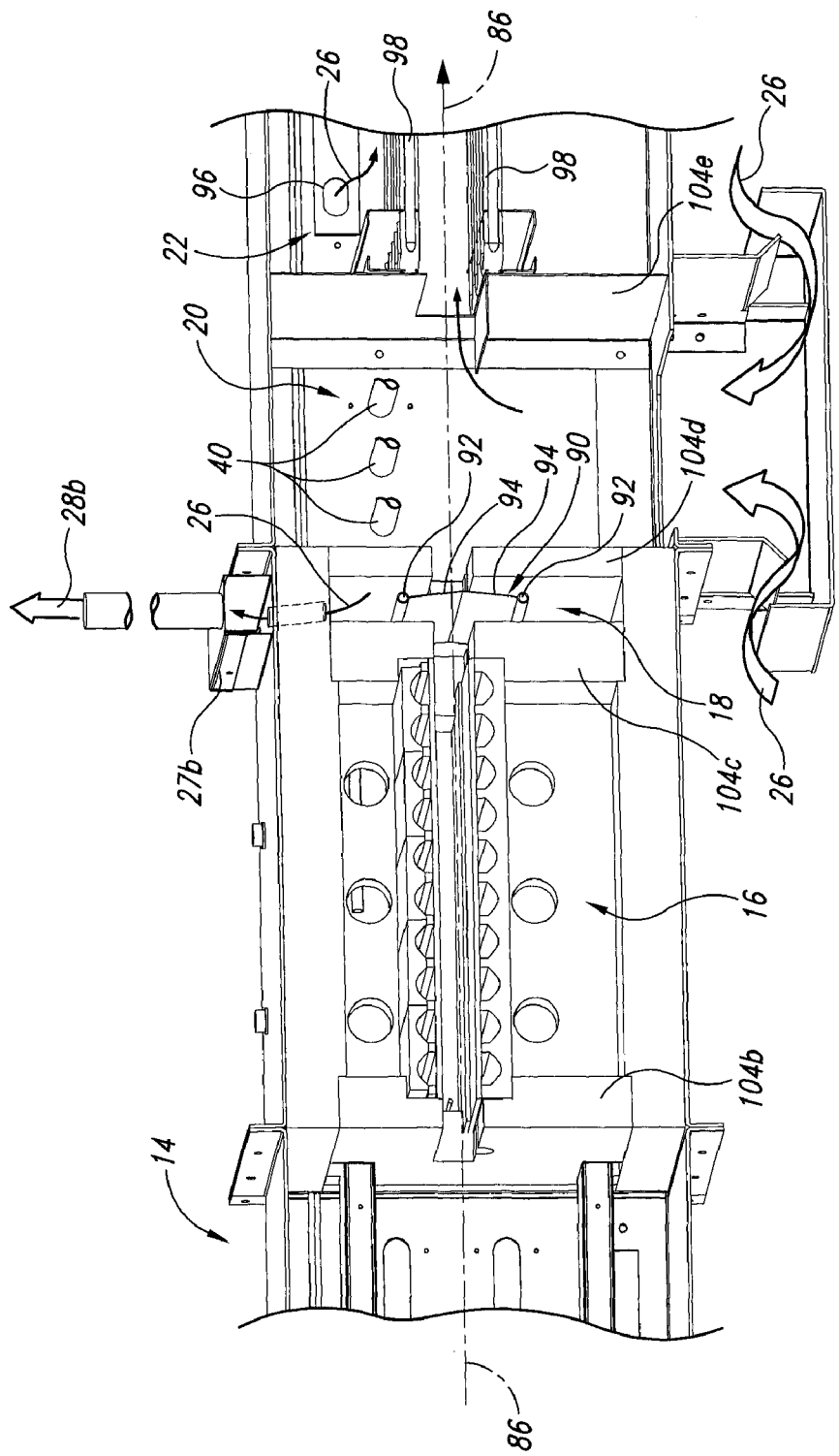
Figure 1D:
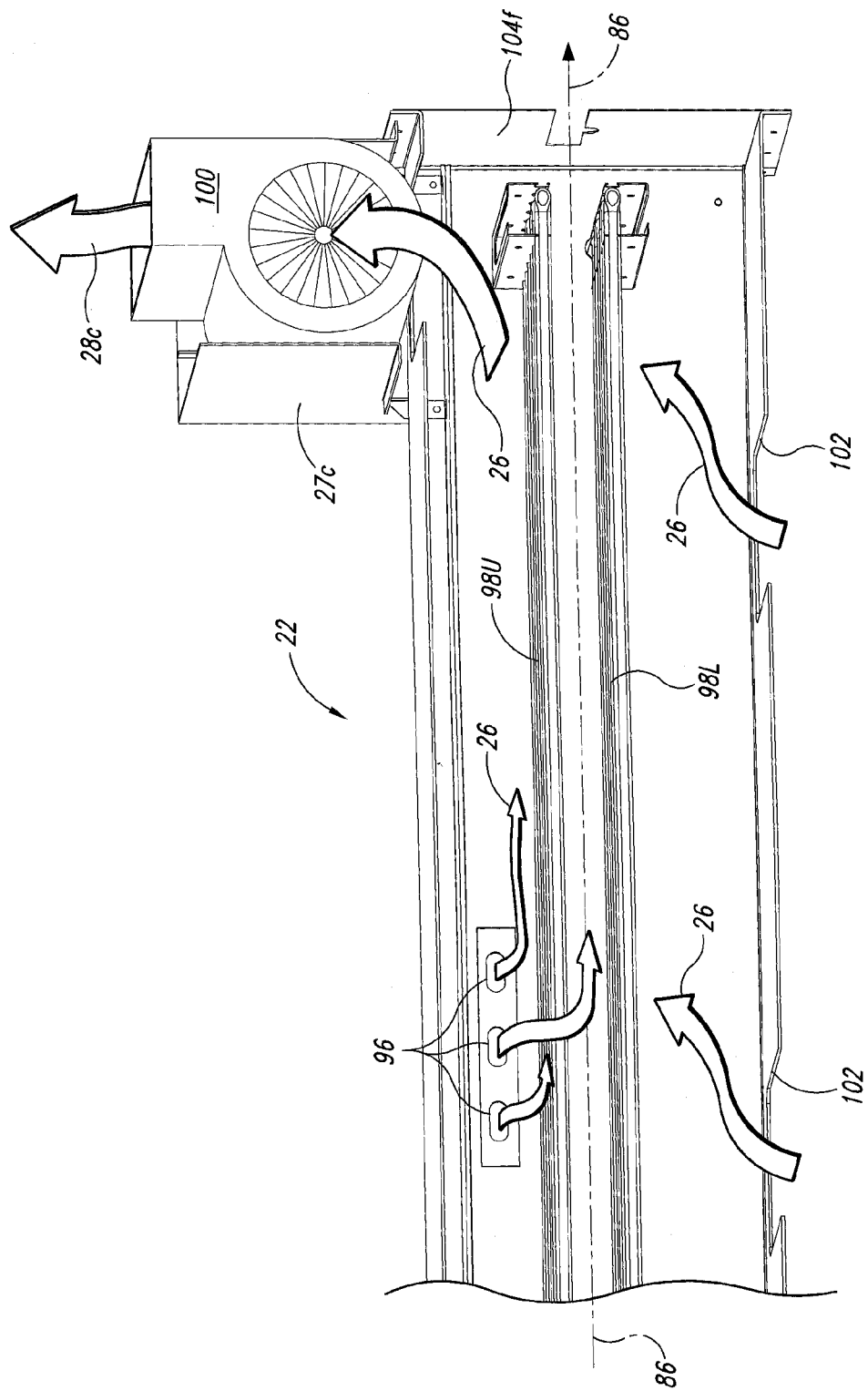

FIGS. 1A and 1B also show the recycle, for greatly improved energy efficiency, of hot air 45 from the spike zone isolation module 16 back upstream into the burn-out zone 14. The air exits via plenum 27a as exhaust air 28a out the flue at the upstream end of the furnace. In addition, air injected in the quench zone 18 exhausts via plenum 27b as exhaust air 28b. FIGS. 1B and 1C show that ambient air 26, introduced from the bottom in stop-quench zone 20 and introduced from the bottom and/or sides of the annealing zone 22, permits control of the temperature profile in those zones. Note in FIG. 1C, cooling air 26 introduced in the bottom of the stop-quench zone 20 exits via the conveyor belt gap in the zone divider wall 104e between that zone and the annealing zone 22. Alternately, the stop-quench zone 20 can be separately vented by its own flue (not shown). In the annealing zone 22, as best seen in FIG. 1D, a heat exchange system, e.g., water pipe manifold may be used to assist cooling (in addition to the cooling air 26). The cooling air 26 exits zone 22 via plenum 27c as exhaust air 28c.

Turning now in more detail to FIG. 1B, this shows in longitudinal section the left side of the burn-out zone (the right side is symmetrically the same) having an entry in the left hand zone divider wall 104a for the conveyor belt 13, which is shown schematically as a wide, flat arrow. The conveyor belt path is shown by the conveyor center line 86 as it traverses the zone toward the right. Above and below the belt are ports 88 for insertion of lamps 40 shown schematically as partial tubes and axis position dots in the figure so as to not obscure the air flow feature. Upper and lower heat recycle manifolds 54U and 54L have spaced apertures 47 for exhaust of hot air 45 from the downstream peak zone, best seen in FIG. 2. In addition, compressed air or inert gas 26 may be injected through lines 92 to assist in temperature control and exhaust of burned-out volatiles and smoke. This hot recycle air and control gas forms a generally laminar stream, as shown by the large ribbon 45 extending from right to upper left, where it exhausts out the flue manifold 27a and the flue pipe as exhaust air 28a.

FIG. 1C continues downstream from the right end of the burn-out zone 14, shown on the left, to the left end of the annealing zone 22, beginning rightward of the zone divider wall 104e, shown on the right. As before, the centerline of the conveyor belt is shown as 86. Exiting the burn-out zone 14 through slot in zone divider wall 104b, the belt 13, carrying product cell wafers 12 (not shown for clarity) in process zone 11, enters the peak zone 16, which is shown in detail in FIGS. 2-6A, 7A and 7B. The peak zone raises the temperature of the product wafers rapidly from the burn-out temperature, typically in the range of 400° C.-450° C., to the selected peak temperature for melting the silver of the contact lines printed on the upper surface and sintering the flux and alloying the back side paste. The peak temperature is selected based on the properties of the contact and back paste compositions. The isolation peak zone modules of the instant invention rapidly fire the solar cell wafers typically into the range of from about 750° C. to about 950° C. at rates in a range in excess of 80° C./sec to up to about 200° C./sec, preferably in the range of above about 100° C./sec to about 160° C./sec. That firing rate is on the order of twice the current furnace capacity, and permits heating rates at up to the maximum lamp power rating without undue lamp failure, while providing on the order of 2× greater throughput of solar cells with greater operating efficiencies. The inventive lamp isolation module thus provides a high rate of temperature increase slope which prevents excess degassing of Hydrogen from the substrate cell. The lamps in this zone can be powered in sub-zones, or individually power-programmed so that the peak temperature is reached near the exit zone divider wall 104c.

The peak zone terminates in zone divider wall 104c, and the belt with product immediately enters the quench zone 18, defined between wall 104c and wall 104d. A compressed air or inert gas knife assembly 90 comprises lateral spaced compressed air tubes 92 having slits therein that form and direct a plane of air 94 onto the product on the belt. This drops the temperature very quickly by several hundred degrees Centigrade, preventing the etch-through of the molten silver contacts into the doped emitter layer. The cooling curve slope is equally steep, thus permitting control of the width of the temperature curve peak, that is, the dwell at the contact melt and sinter formation temperature. Together, the lamp power control in the peak zone and the rapid, controlled quenching, permits precise control of this critical peak dwell process step. The cooling air, after exiting the knife, becomes heated and exhausts out flue plenum and stack 27b as hot air 28b independent of other air streams. For a given conveyor speed and length of the quench zone between zone walls 104c and 104d, the compressed air temperature and volume are controllable to provide any pre-selected amount of cooling for a particular industrial process. Temperature drops of 400° C. to 600° C. within a few seconds is entirely within the capability of the inventive furnace.

To insure there is no overcooling, also called "overshoot", the quench is stopped in optional stop-quench zone 20 by a combination of lamps 40, and optional auxiliary cooling air 26 entering via baffles from below. As in other lamp zones, the power to these lamps may be easily controlled to provide any level of heat, so that the curve transitions smoothly to the annealing temperature required to temper and promote good adhesion, which takes place in the annealing zone 22, just downstream (to the right in this figure) of zone divider 104e. Note the slot between the stop-quench and anneal zone is large, permitting the air to flow without turbulence into the down-stream zone 22.

FIG. 1D illustrates the annealing zone features, in which the cells are held at a pre-selected temperature for a time period adequate to promote adhesion, and then cooled for offloading downstream of the zone exit wall 104f. The temperature profile in this zone is selectively controlled by a combination of inlet air 26, introduced through bottom inlets 102, and/or through side wall ports 96. The air heats up as it cools the wafer substrates and is exhausted out plenum 27c as hot exhaust air 28c, and this may be controlled and assisted by use of an ID fan 100.

Two examples of metallization furnaces for preparation of photovoltaic cells are shown in Table 1, below, one without a dryer section, Example 1, and one with a dryer section, Example 2.

TABLE 1

Metallization Firing Furnace Configurations

| | Example 1 - No Dryer | Example 2 - With Dryer |
|---|---|---|
| Process Furnace Configuration | | |
| Parts Clearance (belt-to-upper-window) | 20 mm | 20 mm |
| Entrance Baffle, 24a | 200 mm | 200 mm |
| Heated Length 14, 16 | 2000 mm | 2000 mm |

TABLE 1-continued

Metallization Firing Furnace Configurations

|  | Example 1 - No Dryer | Example 2 - With Dryer |
|---|---|---|
| Number of Heated Process Zones 14, 16 | 5-6 | 5-6 |
| Rapid Cooling Quench/Stop Zones 18/20 | 250 mm | 250 mm |
| Cooling Air (in 22) | 1185 mm | 1185 mm |
| Cooling Heat Exchange (in 22) | 1185 mm | 1185 mm |
| Max. Operating Temp. in Peak Zone, 16 | 1000° C. | 1000° C. |
| Dryer (Inline) Upstream |  |  |
| Entrance Baffle | — | 200 mm |
| Heated Length | — | 2,800 mm |
| Exit Baffle | — | 200 mm |
| Gap (between Dryer/Furnace) | — | 400 mm |
| Number of Dryer Zones | — | 3 |
| Maximum Operating Temperature | — | 500° C. |
| Electrical/Facilities |  |  |
| Process Exhaust, Venturi | 2 | 4 |
| Power (Kw) Peak - Typical | 84-35 Kw | 126-48 Kw |
| Clean Dry Air (CDA) @ 75 PSI | 614 LPM/1,300 SCFH | 800 LMP/1,700 SCHF |
| Belt Width, 13 | 250 mm | 250 mm |
| Speed of Conveyor, 13 | 650 cm/min. | 650 cm/min. |
| Load/Unload Station | 600 mm/1000 mm | 600 mm/1000 mm |
| Overall Length/Width | 6,400 mm/900 mm | 9,800 mm/900 mm |
| Wafer 125 × 125 mm @ 650 cm/min. | 3,000 wafer/hour | 3,000 wafer/hour |
| Wafer 156 × 156 mm @ 650 cm/min. | 2,420 wafer/hour | 2420 wafer/hour |

Figure 2:
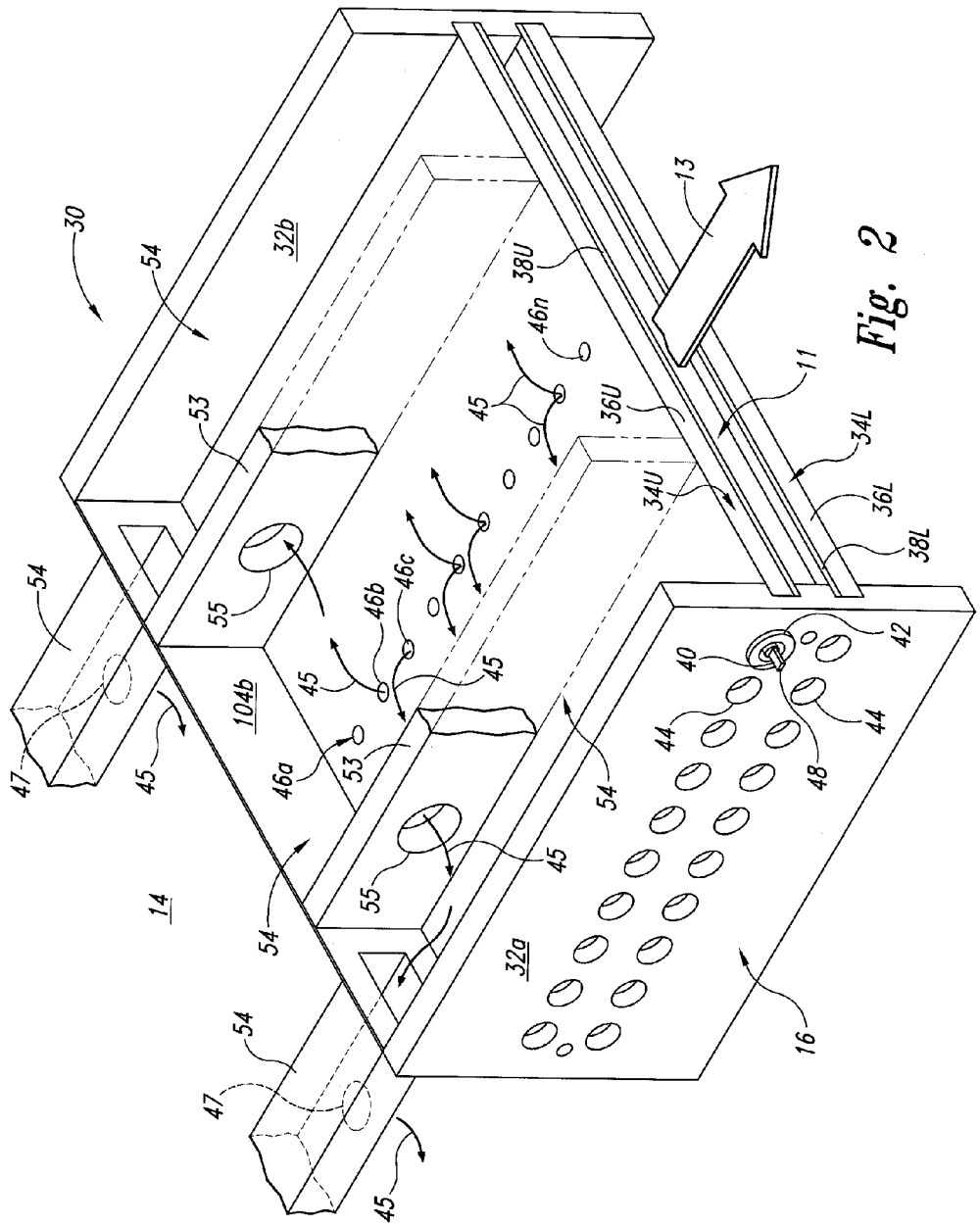
FIG. 2 is a schematic isometric view of an exemplary peak heating zone employing the inventive heating element isolation modules, top and bottom and showing recycle to the burn-out zone.

FIG. 2 shows in simplified detail an exemplary heating module 30 of this invention for the spike zone 16 firing of the cells 12. The path and direction of the conveyor belt 13 in the process zone 11 is shown by the arrow. The process zone is defined between upper and lower heating element (IR lamp) isolation modules 34U, 34L, respectively, which are retained in place by grooves in the side walls 32a, 32b, as shown. The isolation modules comprise a reflector element 36 into which channels or cavities are formed, each of which channels contain one or more IR heat lamp tubes 40, and the open faces of the channels are covered by a transmission window or plate, 38, typically of quartz, Vycor, Robax glass or other high temperature resistant plate material that transmits IR radiation. The lamps 40 are retained laterally, and centered in the channels by a ceramic centering and retaining fitting 42 that is received in bore 44 in the respective side walls 32a, 32b. A series of channel exhaust holes 46a-46n, one for each channel, are provided for exhaust of the now hot cooling air or gas. In this embodiment the exhaust holes or ports 46 are centered along the longitudinal axis of the heating module 30 to permit cooling air 45 to exhaust laterally through holes 55 in spaced longitudinal baffles 53, and thence back upstream via conduits 54, as shown by the sequence of arrows. The conduits include spaced holes 47 therealong to direct the heated air 45 into the burn-out zone as shown in FIG. 1. This recycle of the air heated in the spike zone lamp conduits into the burn-out zone is a substantial heat exchange and energy saving feature of the invention.

An electrical connector for each lamp is shown at 48. Above the upper and lower reflector blocks 36U, 36L are disposed refractory insulation, typically, a commercially available ceramic fiber board, not shown in this view. This module fits in the furnace shell 50 at the appropriate location to form one of the process zone sections, either a burn out section 14a-14d, or a firing section, 16, such as a spike zone, or a stop-quench zone module 20.

Figure 3A:
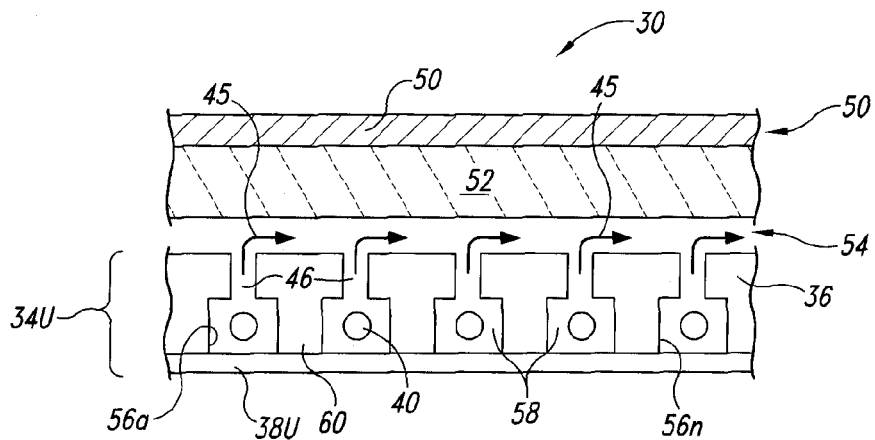
FIG. 3A shows a square or rectangular channel geometry.
Figure 3B:
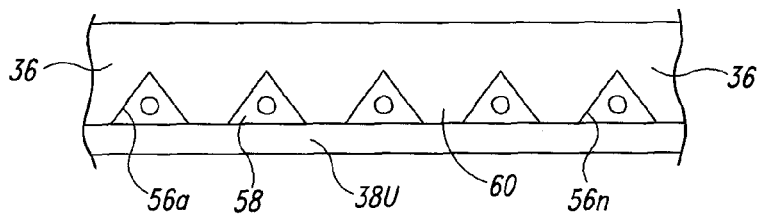
FIG. 3B shows a triangular reflector channel geometry.
Figure 3C:
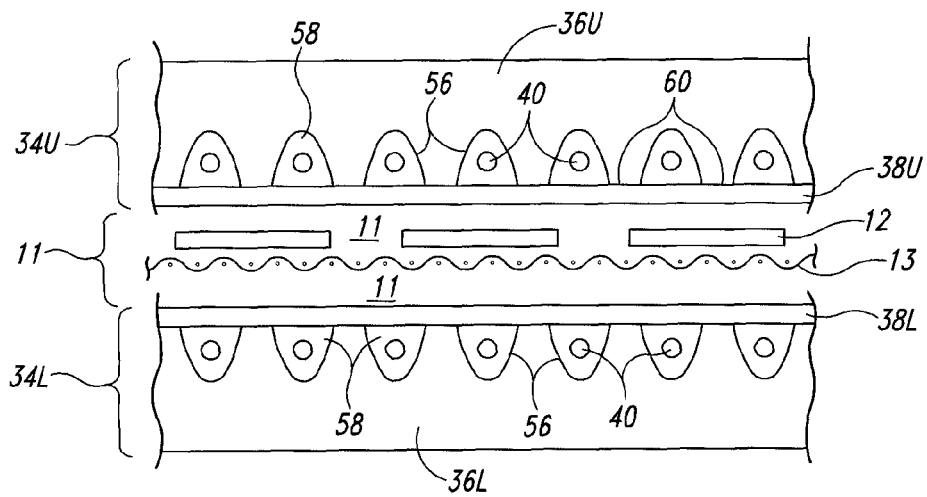
FIG. 3C shows the preferred parabolic geometry.

FIG. 3 shows alternative embodiments, taken as longitudinal section views along the centerline of the furnace through either an upper heating lamp isolation module, or the entire module, that is, both upper and lower lamp isolation module. In FIG. 3A, the outer furnace metal shell is shown at 50, the layer of refractory insulation at 52, and the module 34U is spaced below (inside the shell). The cooling gas 45 exhaust manifold is shown at 54, which communicates with each channel 56a ... 56n via the exhaust ports 46a-46n. The lamps 40 are centered in each channel, leaving an annular space 58 through which the cooling gases flow. The channels are shown as relatively square or rectangular in cross section. In FIG. 3B, the channels are shown as generally triangular in cross section. In this figure, the exhaust ports have been omitted, this showing an example of the end-to-end cooling embodiment. In FIG. 3C, the reflective channels 56 are shown as generally parabolic in cross section.

The reflector block 36 is on the order of 2-3 cm thick and is typically a dense, rigid ceramic fiber board, commercially available. Other materials may be employed, such as silica foam, silica ceramics and preferably have an IR reflectance on the order of above about 85%, preferably above about 95%. The channels may be cast, molded or machined into the board, e.g., by milling, and may be lined with a highly reflective material, such as a quartz cloth that is secured or glued to the inside surface of the channel, e.g., by water glass. The reflector block 36 needs not be, but may be, bonded to the IR transmission plate 38. Note the separator ribs 60 between the adjacent channels 56 provide for adequate sealing between adjacent channels. Thus the transmission plate 38, being snugly fitted against the ribs 60 of the reflector block 36, forms the isolation function for the heating lamps 40, permitting air or gases to flow in the annulus 58 around the lamps effecting the cooling of the inventive heating module assembly. The transmission plate need not, but may be polished on one or both sides; the side facing the reflector block ribs is preferred to be smooth, as by grinding, and both sides may be ground.

Figure 4:
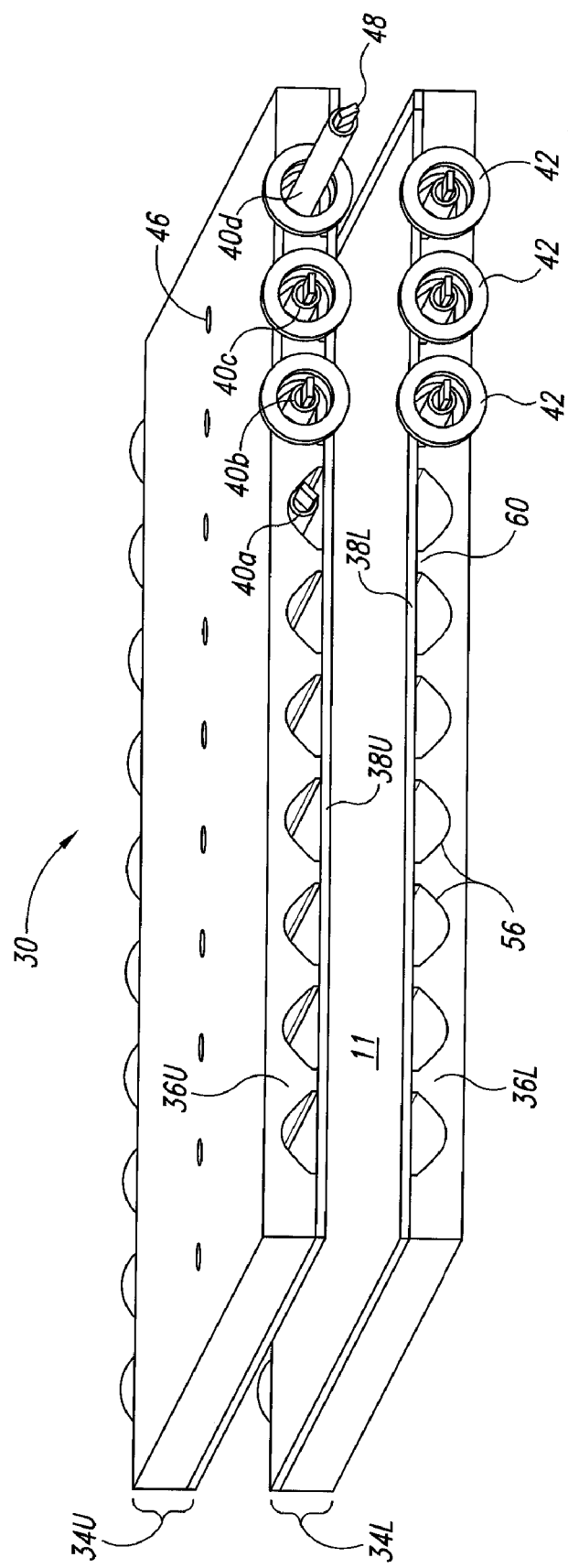
FIG. 4 is a transverse schematic isometric view of the spaced, paired heating element isolation modules showing the lamp centering fittings and lamps inserted in several of the channels.

FIG. 4 shows in isometric longitudinal view the parabolic channel embodiment of the upper and lower modules 34U, 34L which comprise the heating module assembly 30 of FIG. 3C, which is the presently preferred embodiment. In this view, the parabolic channels 56 are spaced apart by ribs 60. As shown, the wide ends of the parabolic channels 56 terminate above the surface of the mating transmission plate 38 so that the ribs 60 have straight, vertical side walls. Several heat lamps 40 are shown installed in the channels, with lamps 40*a*, 40*b*, 40*c* being fully in place, and lamp 40*d* pulled out to show how it fits in and is retained by the end fitting 42. In this embodiment, the exhaust ports 46 may be rectangular slots, preferably oriented transversely (parallel to the channel axis), rather than being holes as shown. In this embodiment, the length of the lamps is greater than the width of the process zone, so the lamps extend through the end fitting elements 42 so they may be connected to the electrical bus via connectors 48.

The longitudinal, horizontal center-to-center, spacing of the lamps can be varied as the process operations require, and the geometry of the parabola, triangular, square/rectangular cooling channel 56 is easily adjusted to accommodate the spacing required. Thus, in wide spacing, the parabola or triangle may be wide at its opening; in closer spacing the parabola and triangle narrower, and the square may become a vertically oriented rectangle. By way of example, the triangle in wide spacing may be equilateral, and in closer spacing, isosceles. Thus, not only is there individual power control of the lamps, but their spacing may be varied. Together, they provide the functionality to permit universal and essentially continuous variability in the temperature profile, so that the inventive heating zone module 30 is easily configured to a wide range of industrial processes.

Figure 5A:
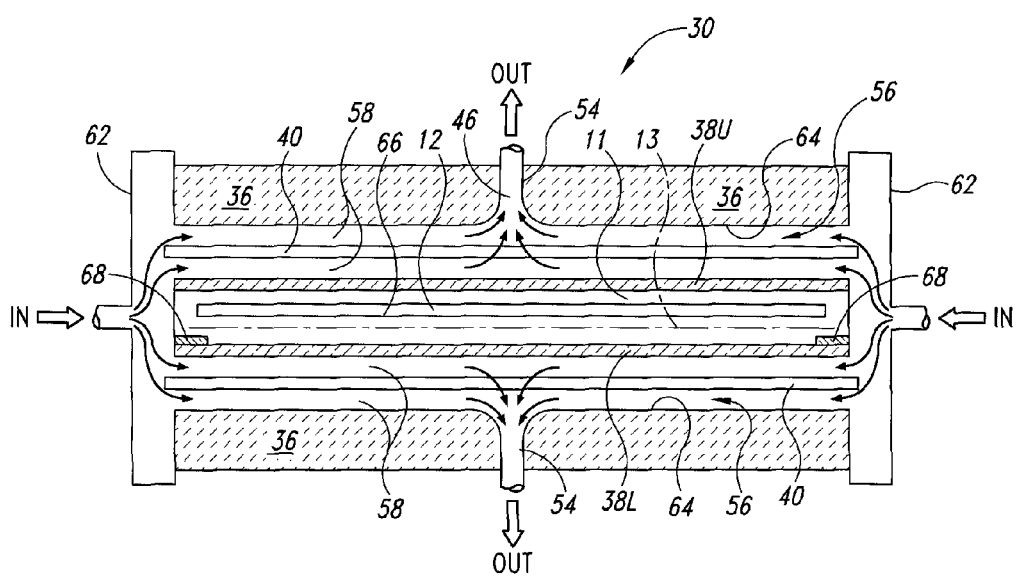
FIG. 5A shows a first embodiment of side to side cooling flow.
Figure 5B:
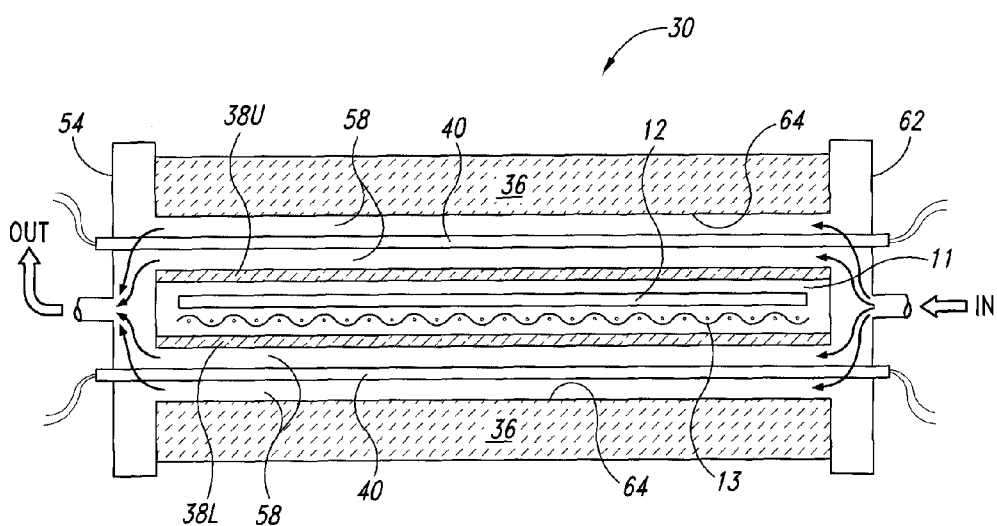
FIG. 5B shows dual side entry and center exhaust flow path for the cooling gas.

FIG. 5 shows cooling geometry in transverse section view, with FIG. 5A being directed to the preferred embodiment in which compressed cooling air is provided to the air cooling passages 58 at each end of the heat lamp 40 via inlet manifolds 62. The cooling air passes along the annular space all around the lamp tube 40 created in the channels 56 between the reflective surface 64 and the transmission plate 36. The hot hair is exhausted out the centerline port 46 via exhaust manifold 54 connected to an induced draft eductor fan or flue. An exemplary doped silicon solar cell wafer 12 is shown riding on the conveyor belt 13, supported at its edges by slide plates 68 within the process zone 11. In FIG. 5B, the inlet manifold 62 is on the right, and the hot gasses exhaust on the left via manifold 54. The remaining parts are the same.

Figure 6A:
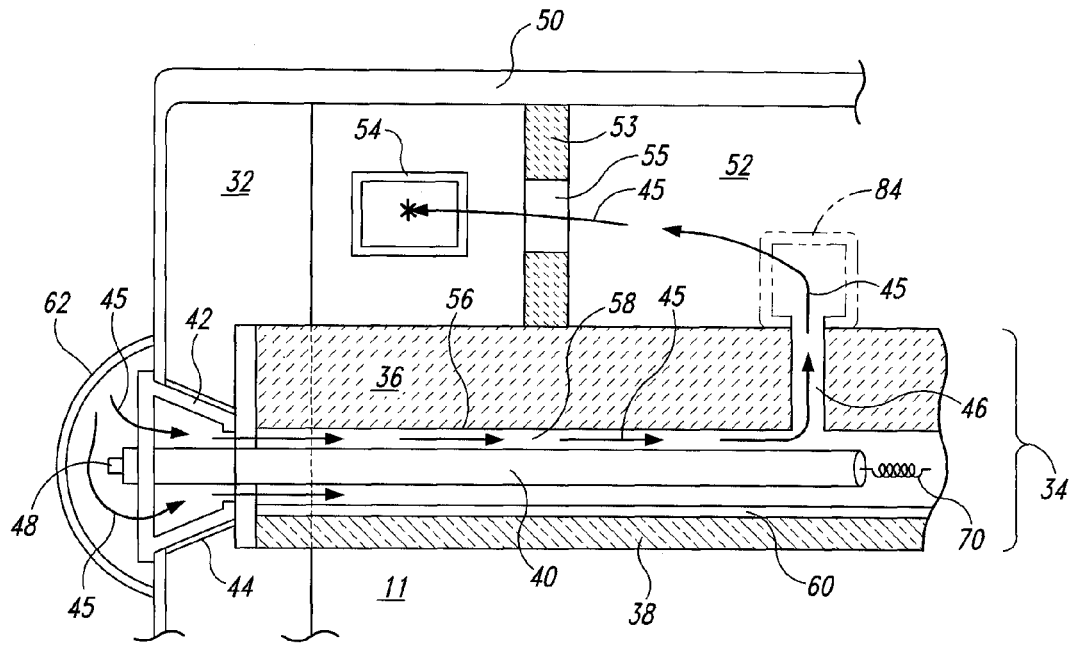
FIG. 6A shows in transverse elevation and FIG. 6B shows in isometric a first embodiment.
Figure 6B:
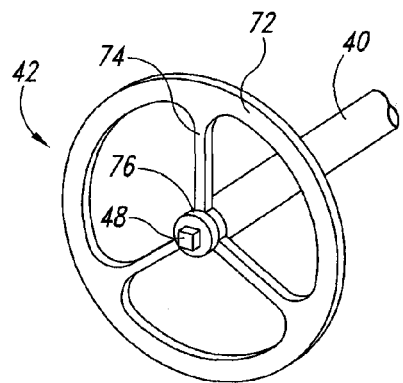
Figure 6C:
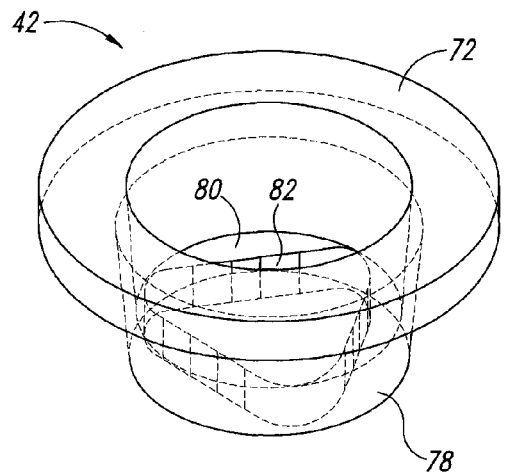
FIG. 6C shows in isometric a second, preferred centering fitting.

FIG. 6 is a series showing the detail of the lamp end fitting, typically made of cordierite or steatite, that serves to support and retain the lamp in proper orientation, in which FIG. 6A shows the lamp 40 with filament 70 relatively centered in the channel 56 by a cup shaped fitting 42 inserted in bore 44 in the side wall 32 (see also FIG. 2) so that there is ample space for air to flow in the cooling passage from the inlet manifold 62 on the right to the center exhaust manifold 54 in the center, via the exhaust port 46. FIG. 6B shows a first embodiment of an end fitting 42 in which a ring or flange 72 engages the bore hole 44, and a plurality of radial webs 74, typically 2-4, terminate centrally in a collar 76 in which the lamp tube 40 is fitted. FIG. 6C shows the presently preferred embodiment of end fitting 42 in which a flange 72 is connected to a cylindrical or tapered sleeve 78 that fits in the borehole 44 (see FIG. 6A) and terminates in a transverse end piece 80 having a triangular cut-out 82 through which the tube 40 is fitted.

Figure 7A:
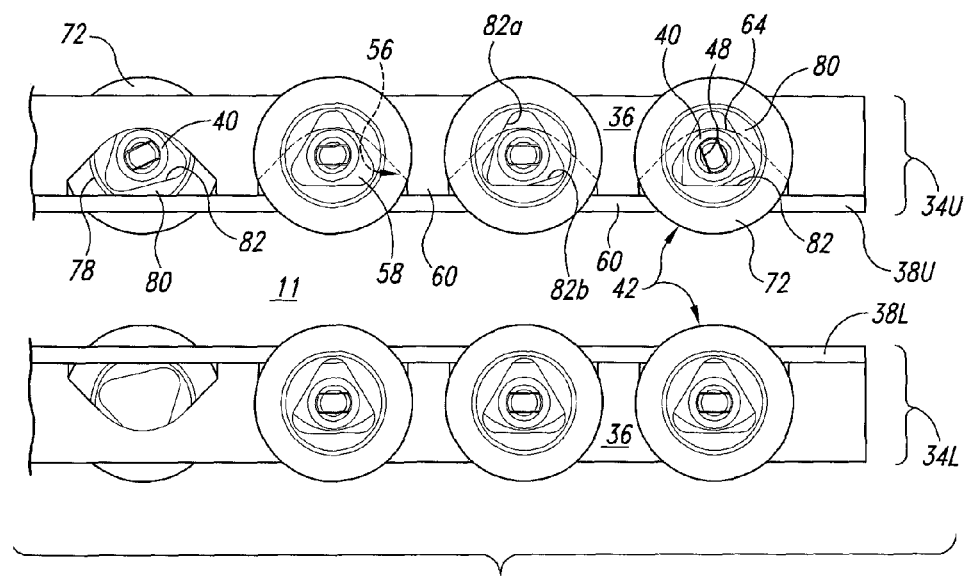
FIG. 7A shows in side elevation an enlarged view of the end fitting and FIG. 7B is an isometric of the fittings and the heat lamps disposed in the channels.
Figure 7B:
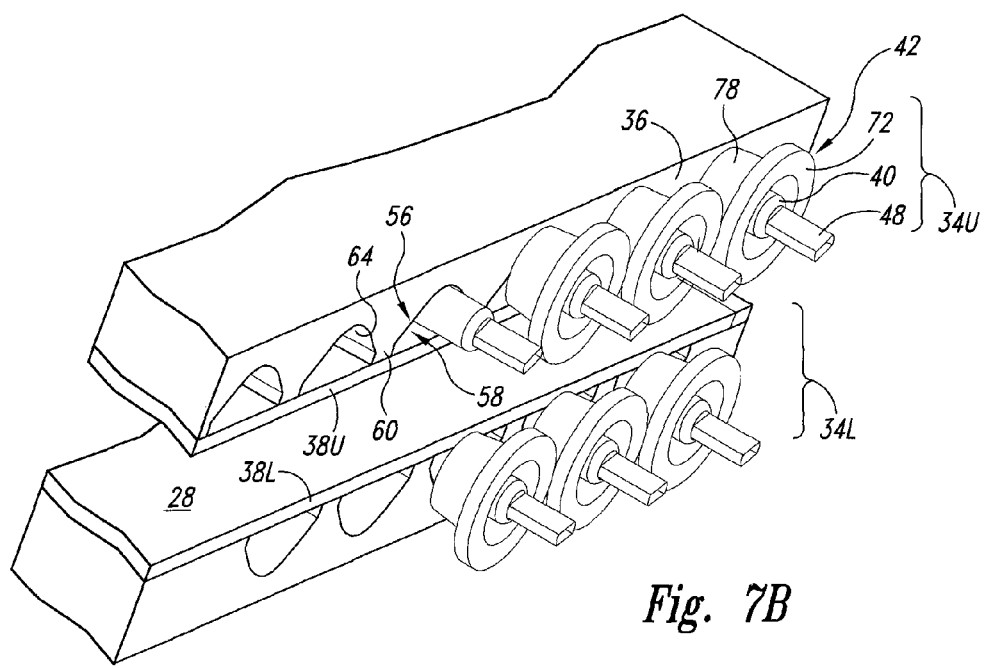

FIG. 7A is a side elevation, enlarged to show the lamp end fittings 42 mounted to the upper and lower reflector blocks 36 having a plurality of, in this case, parabolic channels 56, each separated by a rib 60. The side wall is not shown for clarity, it being understood that the sleeve 78 is inserted in the corresponding bore 44 (see FIGS. 2 and 6A). Note the triangular cut-out 82*a* of the near side end fitting 42 does not need to be precisely aligned with the orientation of the cut-out 82*b* of the far side end fitting (third from the left upper end fitting). Since the apexes of the triangle are rounded the location of the tubes is essentially self centering. A slight gap is shown between the tube edge and the edge of the cut-out 82, but it should be understood that the tube rests on the edge of the cut out. Likewise there is some space between the tube surface and inner reflective surface of the channel. FIG. 7B is the same representation rotated to show in isometric view the relationship of the depth of the sleeve 78 to the reflector block 36. The bottom of the end fitting may contact the block, or may be spaced form it, e.g., by 2-10 mm.

Figure 8:
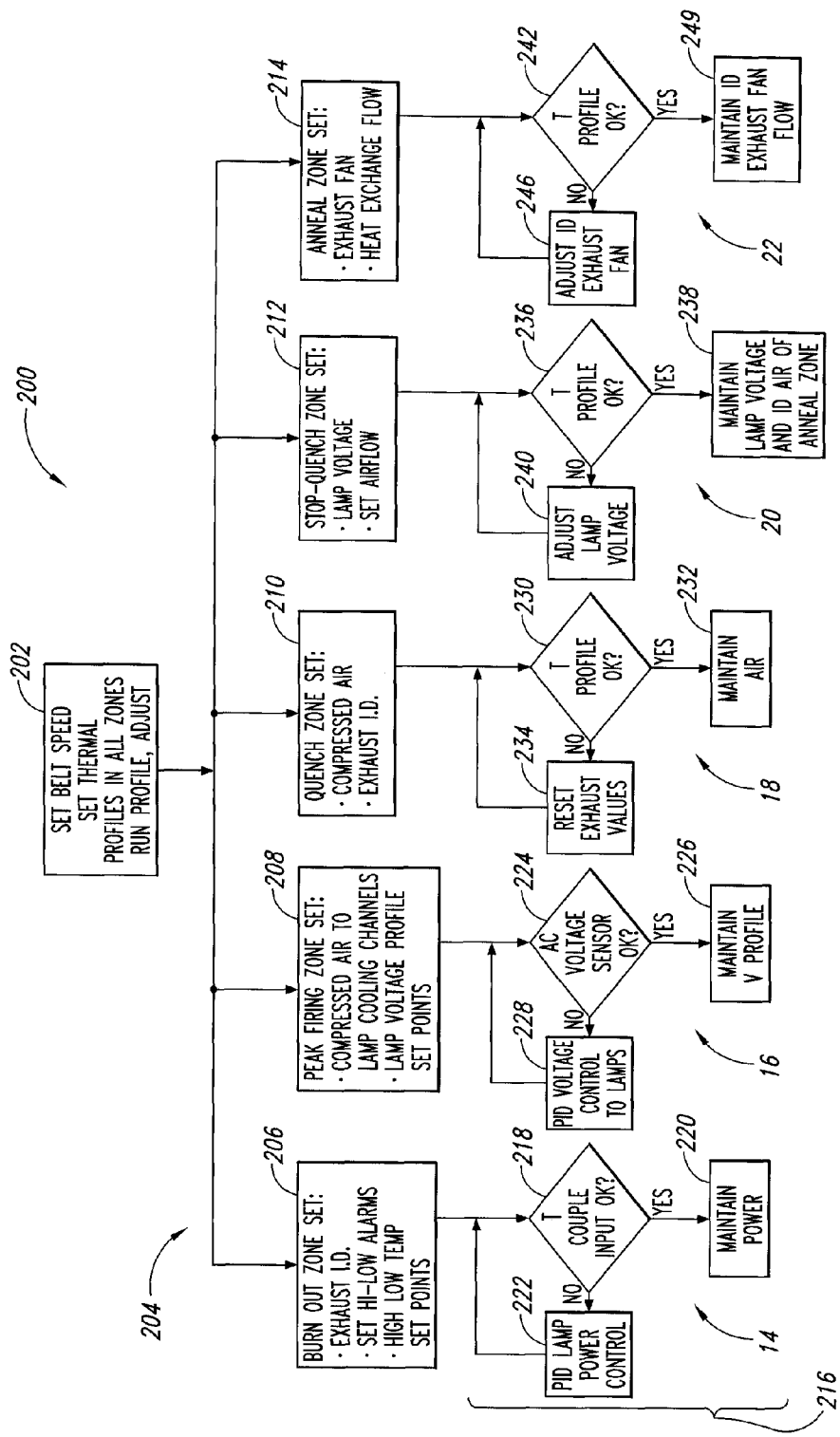
FIG. 8 is a flow sheet of the configuration and method aspects of the inventive process showing control parameters and feed-back loops.

FIG. 8 is a flow sheet showing furnace zone configuration and operational processes of "firing" solar cell wafers or other industrial products that can be processed through the inventive furnace system as shown in FIG. 1. The processes underlying the furnace zone configuration and operation, communications with operators and others, network-implemented management and furnace operation and archival history preserved in one or more databases, as described herein, are typically implemented in software as computer-executable instructions, that upon execution, initiate, monitor and adjust the operations of the furnace system to perform the method of firing illustrated and described herein. The server(s) of the inventive system may be implemented as one or more computers, configured with server software to host a secure, private network, or site on the Internet, to serve static, generally informational pages, and to generate and serve dynamic pages showing arrays of selected files and images, tailored to facilitate the operations and method described herein. The dynamic pages are tailored to individual furnace-operator requirements and may be generated on the fly in response to individual requests from authorized, authenticated users via access devices (desktop and laptop computers, network computers, etc.) which may be Internet linked. The network may be linked to the Internet to enable Internet-implemented management and operation.

The computer(s) of the invention can be configured in a system architecture, for example, as one or more server computer(s), database (e.g., relational, metadata structured and hierarchical) computer(s), storage computer(s), routers, interfaces, and peripheral input and output devices, that together implement the system and network. A computer used in the inventive system typically includes at least one processor and memory coupled to a bus. The bus may be any one or more of any suitable bus structures, including a memory bus or memory controller, peripheral bus, and a processor or local bus using any of a variety of bus architectures and protocols. The memory typically includes volatile memory (e.g., RAM) and fixed and/or removable non-volatile memory. The non-volatile memory can include, but is not limited to, ROM, Flash cards, hard disk drives including drives in RAID arrays, floppy discs, mini-drives, Zip drives, Memory sticks, PCM-CIA cards, tapes, optical drives such as CD-ROM drives, WORM drives, RW-CDROM drives, etc., DVD drives, magneto-optical drives, and the like. The various memory types provide for storage of information and images, including computer-readable instructions, zone configuration templates, templates for configuring individual lamps or groups of lamps, data structures, program modules, operating systems, and other data used by the computer(s).

A network interface is coupled to the bus to provide an interface to the data communication network (LAN, WAN, and/or Internet) for exchange of data among the various site computers, routers, authorized user's/organization's computing devices, and service/product supply vendors for support of the system, and customers, as needed. The system also includes at least one peripheral interface coupled to the bus to provide communication with configured individual peripheral devices, such as keyboards, PDAs, laptops, cell phones, keypads, touch pads, mouse devices, trackballs, scanners, printers, speakers, microphones, memory media readers, writing tablets, cameras, modems, network cards, RF, fiber-optic, and IR transceivers, and the like.

A variety of program modules can be stored in the memory, including OS, server system programs, HSM system programs, application programs, and other program modules and data. In a networked environment, the program modules may be distributed among several computing devices coupled to the network, and used as needed. When a program is executed, the program is at least partially loaded into the computer memory, and contains instructions for implementing the operational, computational, comparative (e.g., sensed signal value of a particular container's air sample vs the threshold value), archival, sorting, screening, classification, formatting, rendering, printing and communication functions and processes described herein.

The user, operational data relationships (including history of operations), operational and related types of data are stored in one or more sets of data records, which can be configured as a relational database (or metadata-type, hierarchical, network, or other type of database, as well) in which data records are organized in tables. Such records may be selectively associated with one another pursuant to predetermined and selectable relationships, so that, for example, data records in one table are correlated to corresponding records for the customers in another table and the correlation or individual datum is callable for rendering on screen, printout or other activity pursuant to the inventive method and system.

The system is fully configurable, and a full set of application program templates permits individual authorized, authenticated users to configure each zone operation individually, as described in detail with reference to FIG. 8, as well as receive and store data reports, provide alert(s), and the like. One of skill in this art will easily be able to adapt the inventive multi-zone furnace operation system to the particular needs of a given product IR processing furnace.

As shown in the FIG. 8 flow sheet of furnace operation process 200, an exemplary firing operation, such as shown in Table I, begins with configuring zones 202, typically via fill-in templates displayed on a control computer display, to set the belt speed, which is constant in all zones as the belt is continuous through furnace 10 (FIG. 1), and then configure a thermal profile in all zones 14-22, which is pre-selected for a particular advanced material to be fired in the furnace. The pre-selected, pre-set profile is checked against an actual run profile (without product) by transporting a thermocouple through the furnace to produce and on-screen profile curve display.

For zone configuration 204 the operations program steps through each zone in turn, starting with the Burn-Out Zone 206 with setting the rate or volume (cfm) of the induced draft exhaust fan, the high and low over-temperature alarm settings, and the high and low temperature set points for the lamps. The Peak Firing Zone is configured 208, setting the compressed air input to cool the lamps and the lamp voltage set points (either individually or as one or more groups of lamps 40 in the zone) to conform to the temperature increase curve required in the peak zone 16 (see FIG. 1). Next, the Quench Zone is configured 210 by setting the compressed air supply to the air knife and exhaust (natural draft or ID fan). The Stop-Quench Zone is configured 212 by setting the lamp voltage, either individually or as a group, and the airflow (which can range from zero to the desired amount to stop the quench). Finally, the Anneal Zone is configured 214 by setting the exhaust induced draft fan and heat exchange tube water flow. Optionally, variable air inlet ports (side and/or bottom walls) can be set.

Upon configuration completion, the furnace operation method 216 is shown in the logic portion of FIG. 8 (reference should also be made to FIG. 1). In the Burn-out Zone 14, thermocouples in the zone output signals representing sensed temperature levels. These are compared 218 to the set points, and if the values are within set parameters, the lamp power is maintained 220. However, if the values do not fall within the set parameters, a PID-type controller adjusts the lamp power 222 until the thermocouples report proper values.

In the peak zone 16, AC voltage sensor signal(s) (or, optionally, thermocouple signals), for each lamp or groups of lamps, as the case may be, are compared 224, to the set parameters, and if within the selected range, the voltage profile is maintained 226, whereas if not a PID controller adjusts the voltage to the lamp(s) as needed 228 to bring them back to within the profile. AC Voltage control of the lamp output is preferred to thermocouple control.

In the Quench Zone 18, the temperature is monitored via profiling 230 and if within profile, the air flow to the air knife is maintained 232, whereas if not, the exhaust or compressed air values to the air knife are adjusted 234 to bring the temperature to within the pre-selected profile.

In the Stop-Quench Zone 20, the temperature is monitored 236, and if within profile, the lam voltage and setting of the induced draft fan in the downstream Anneal Zone are maintained 238, whereas if not, the lamp voltage is adjusted 240 to bring the temperature back within profile.

In the Anneal Zone 22, the temperature is monitored at one or more positions along the zone, and if the profile is OK, 242, the exhaust fan setting is maintained 244, whereas if not the air flow of the exhaust fan is adjusted 246 to bring the temperature back within profile. Typically, no lamps or other heat source (other than exhaust gases from the quench and/or stop-quench zone(s)) are provided in this zone.

INDUSTRIAL APPLICABILITY

It is clear that the inventive heat element isolation module with cooling channels has wide applicability to the processing of advanced substrate materials, in that furnace systems fitted with such modules will have substantial processing advantages, namely faster throughput due to the ability to operate the lamps at essentially 100% rated capacity for on the order of 2× or more heating rate without compromising lamp life. In addition, the recovered heat can be recycled to other areas of the process, including the drying and preheat sections, thereby reducing process energy costs.

It should be understood that various modifications within the scope of this invention can be made by one of ordinary skill in the art without departing from the spirit thereof and without undue experimentation. For example, a wide range of commercially available heating elements, IR lamps and others, may be used. Instead of a channel formed in a reflector block plus a transmissive plate to form isolation cooling channels, the heating lamp may be disposed within a larger diameter quartz tube and the annulus between them forms the cooling passageway for pressurized air or other cooling gas. These tubes can be disposed in an array below the ceramic insulation (for the upper module), either with or without vertical baffles there between to optionally eliminate tubes heating adjacent tubes. The reflector block instead of being monolithic with channels cut or formed therein, can be simply a thick sheet of the rigid ceramic fiber insulation with triangular pieces of similar material forming vertical baffles (base up, point down for the upper module); these baffles can be glued to the sheet with water glass-type cement. In another alternative construction, glass cloth can be draped from opposite side walls in a corrugated pattern, with the concave-down corrugations forming the channels in which the heat lamp tubes are positioned above the quartz window that serves as the IR transmissive plate. In all these alternative embodiments, the isolation system will permit operating the process zone at other than atmospheric pressure, and with other than air; thus inert or reactive process gases may be used. The rate of cooling is easily adjusted and controlled, and the ribs may be reduced or eliminated. A PLC controller can be used to provide selectable menus of process parameter control, including but not limited to belt speed, power ramping for selected substrates, peak temperatures, dwell time in spike zones, cool-down rates, cooling air flow rate, heat exchange rate, and the like. This invention, in both its combination and sub-combination aspects is therefore to be defined by the scope of the appended claims as broadly as the prior art will permit, and in view of the specification if need be, including a full range of current and future equivalents thereof.

Parts List: Provided for covenience during Examination, may be cancelled upon Allowance.

| | |
|---|---|
| 10 | IR Process Furnace |
| 11 | Process zone |
| 12 | Wafers being fired |
| 13 | Conveyer belt |
| 14 | Burn-Out Section |
| 16 | Spike Zone Module |
| 18 | Quench Zone (with air knife) |
| 20 | Quench Stop Zone |
| 22 | Cool-Down Tempering/Anneal Zone |
| 24 | Baffles Entrance/Exit |
| 26 | Cooling Air |
| 28 | Exhausts |
| 30 | Firing Zone Module |
| 32a, 32b | Side Walls |
| 34U, 34L | Heating Lamp Isolation Module |
| 36 | Reflector Block |
| 38U, 38L | Transmission Plate |
| 40 | High Intensity IR Heat Lamp |
| 42 | End Fitting |
| 44 | Bore for Lamp Retainer Fitting |
| 45 | Lamp Cooling Air Flow Path |
| 46 | Channel Exhaust Port |
| 47 | Recycle duct hot gas outlets |
| 48 | Electrical Connector for Lamp |
| 50 | Metal Shell |
| 52 | Refractory Insulation |
| 53 | Flow Baffle |
| 54 | Exhaust Manifold |
| 55 | Port |
| 56 | Cooling Channels |
| 58 | Annular Cooling - Gas Passage |
| 60 | Separator Rib |
| 62 | Inlet Cooling Air Manifold |
| 64 | Reflective Surface |
| 66 | Product |
| 68 | Slide Plates |
| 70 | Lamp Filament |
| 72 | Ring or Flange |
| 74 | Web |
| 76 | Collar |
| 78 | Cylindrical, Tapered Sleeve |
| 80 | End piece |
| 82 | Triangular Cut-Out in End Piece |
| 84 | Alternate Exhaust Manifold |
| 86 | Conveyor Centerline |
| 88 | Ports for IR Lamps in Burn Out zone |
| 90 | Quench Zone Air Knife Assembly |
| 92 | Compressed Air Supply tubes |

-continued

Parts List: Provided for covenience during Examination, may be cancelled upon Allowance.

| | |
|---|---|
| 94 | Planes of Air flow from air knife |
| 96 | Side Wall air inlets in Anneal zone |
| 98 | Heat Exchange lines (water cooled) |
| 100 | ID Draft Fan |
| 102 | Bottom air inlet ports in Anneal Zone |
| 104 | Zone divider walls |
| 200 | Process operational method |
| 202 | Configure belt & zone T profiles |
| 204 | Zone configuration |
| 206 | BOZ configuration |
| 208 | Peak zone configuration |
| 210 | Quench zone configuration |
| 212 | Stop-Quench zone configuration |
| 214 | Anneal zone configuration |
| 216 | Firing method |
| 218 | BOZ thermo-couple reading within limits? |
| 220 | Maintain power |
| 222 | PID controller adjusts power |
| 224 | Peak zone AC voltage reading comparison |
| 226 | Maintain V profiles |
| 228 | PID controller adjusts lamp voltage |
| 230 | Quench zone T profile comparison |
| 232 | Maintain airflow to air knife |
| 234 | Reset exhaust or air flow values |
| 236 | Stop quench T profile comparison |
| 238 | Maintain lamp voltage in zone and fan operation in anneal zone |
| 240 | Adjust lamp voltage |
| 242 | Anneal zone T profile comparison |
| 244 | Maintain fan operation in zone |
| 246 | Adjust fan air flow to re-establish T profile |

The invention claimed is:

1. An IR lamp heating module for multi-zone thermal processing furnaces, comprising in operative combination:
 a. an insulating reflector body having spaced grooves formed in one face thereof;
 b. at least one IR lamp disposed in each groove and spaced from the wall of said groove to provide an annular space for the passage of cooling air between said lamp and said groove wall;
 c. an IR transmissive plate disposed in contact with the grooved face of said reflector body to effectively isolate each lamp from lamps in adjacent grooves and to isolate said lamps from a process zone of said furnace; and
 d. said groove forms a highly reflective surface configured to effectively direct IR light from said lamp through said IR transmissive plate into said process zone.

2. An IR lamp heating module as in claim 1 wherein said groove is configured with a trans-verse cross-section geometry selected from generally parabolic, elliptical, semi-circular, triangular, square, rectangular or trapezoidal.

3. An IR lamp heating module as in claim 1 which includes an end port at each end of said channel for passage therethrough of a gas for cooling.

4. An IR lamp heating module as in claim 3 which includes exhaust ports communicating through said body with each of said channels, said exhaust port being disposed medial of the lateral ends of said channels, and said end ports being adapted to pass cooling gas in the annulus between said lamps and the surface of said channels input at said end ports to said medial exhaust port.

5. An IR lamp heating module as in claim 3 wherein one of said end ports is an inlet for cooling gas, and the opposed end port is an exhaust port so that cooling gas is introduced in one port, cools the lamp by passing in the annulus between the lamp and the surface of the channel and exhausts through the opposed end port.

6. An IR lamp heating module as in claim 3 which includes at least one exhaust air duct for recycle of hot cooling gas exhausted from said channels upstream to a second processing zone of said furnace.

7. An improved multi-zone IR lamp thermal processing furnace, said zones including a conveyor belt for transporting products to be processed continuously through said zones and a cooling system, the improvement comprising in operative combination:
   a. at least one of the zones of said furnace includes an IR lamp isolation module comprising an insulative reflector body of insulator material having in one face an array of grooves, at least one IR lamp disposed in each said groove with said IR lamp spaced from the side wall of said groove to provide an annular cooling space, and an IR transmissive window in close contact with said grooved face of said reflector body to isolate said lamps from a processing zone into which light from said IR lamps is directed;
   b. a gas supply connected to at least one end of said grooves to provide cooling gas to said groove to pass through said annulus to cool said lamp and said IR transmissive plate; and
   c. an exhaust system for removing heated gas from said module grooves as a result of cooling said lamps and IR tramsmissive plate.

8. An improved multi-zone IR lamp thermal processing furnace as in claim 7 wherein said IR lamp isolation module is provided for a spike firing zone.

9. An improved multi-zone IR lamp thermal processing furnace as in claim 8 wherein said exhaust system re-cycles said heated gas upstream to at least one of a burn-out zone and a drying zone.

10. An improved multi-zone IR lamp thermal processing furnace as in claim 9 wherein said furnace includes a tempering zone downstream of said spike firing zone.

11. An improved multi-zone IR lamp thermal processing furnace as in claim 10 wherein said furnace includes at least one of a quench zone and a stop-quench zone intermediate between said spike firing zone and said tempering zone.

12. An improved multi-zone IR lamp thermal processing furnace as in claim 11 wherein said quench zone includes at least one air knife assembly for rapidly reducing the temperature of product on said conveyor belt as it exits said spike firing zone.

13. An improved multi-zone IR lamp thermal processing furnace as in claim 12 wherein said stop-quench zone includes at least one IR lamp to stop the cooling of said product in preparation for tempering in said annealing zone.

14. An improved multi-zone IR lamp thermal processing furnace as in claim 13 wherein said annealing zone includes at least one of a heat exchanger assembly and ports for introduction of controlled amounts of cooling air, to bring the temperature of said product to a desired handling temperature.

15. An improved multi-zone IR lamp thermal processing furnace as in claim 7 which includes a controller for controlling the rate of travel of said conveyor belt, the power to each of said IR lamps in said IR lamp isolation module and said cooling system to provide a relatively infinite range of thermal heating and cooling curves throughout the zones of said furnace.

16. A method of heating product in an industrial processing furnace having a conveyor belt carrying product through multiple processing zones comprising the steps of:
   a. providing a plurality of IR lamps in an array in at least one firing zone;
   b. providing an IR transmissive window between said lamps and said conveyor belt-carried product in said firing zone to isolate said lamps from said product;
   c. cooling said lamps with a cooling gas passed between said window said lamp surface to prevent cooling gas from entering and disturbing the process region through which the belt and product pass adjacent said window;
   d. exhausting said now-heated cooling gas; and
   e. controlling power to permit operation of said lamps at essentially 100% rated capacity for on the order of 2× or more heating rate without lamp warpage or compromising lamp life, thereby providing a 100° C. to 200° C./minute temperature rise and sharp peak temperature with short dwell time.

17. Method as in claim 16 which includes the step of recycling said heated cooling gas upstream to at least one of a burn-out and a drying zone to improve the efficiency of thermal operation by heat exchange.

18. Method as in claim 16 which includes the step of rapidly quenching said product in a quench zone just downstream of said firing zone by passing said product into contact with jets of cool gas directed onto at least one surface of said product.

19. Method as in claim 18 which includes the step of stopping the quenching of said product by providing a controlled level of heat from least one IR lamp to prevent the cooling of the product below a pre-selected minimum.

20. Method as in claim 16 wherein said process is adapted to fire solar cell wafers and which includes the steps of configuring the control of lamp power, said conveyor belt speed, and cooling of said product downstream of said firing zone to provide a pre-selected thermal heating and cooling profile to produce solar cells having improved efficiency.

* * * * *

UNITED STATES PATENT AND TRADEMARK OFFICE
CERTIFICATE OF CORRECTION

| | |
|---|---|
| PATENT NO. | : 7,805,064 B2 |
| APPLICATION NO. | : 11/768067 |
| DATED | : September 28, 2010 |
| INVENTOR(S) | : Peter G. Ragay et al. |

Page 1 of 1

It is certified that error appears in the above-identified patent and that said Letters Patent is hereby corrected as shown below:

In Col 22, line 31, "200°C/minute" is corrected to read "200°C/second".

Signed and Sealed this
Thirty-first Day of January, 2012

David J. Kappos
*Director of the United States Patent and Trademark Office*